US006813197B2

United States Patent
Park

(10) Patent No.: US 6,813,197 B2
(45) Date of Patent: Nov. 2, 2004

(54) DLL DRIVING CIRCUIT FOR USE IN SEMICONDUCTOR MEMORY DEVICE

(75) Inventor: Jong-Hun Park, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 10 days.

(21) Appl. No.: 10/329,564

(22) Filed: Dec. 27, 2002

(65) Prior Publication Data

US 2003/0210578 A1 Nov. 13, 2003

(30) Foreign Application Priority Data

May 10, 2002 (KR) .................................. 10-2002-0025798

(51) Int. Cl.[7] .................................................. G11C 7/00
(52) U.S. Cl. .................. 365/194; 365/233; 365/230.03
(58) Field of Search ................................ 365/194, 233, 365/230.03

(56) References Cited

U.S. PATENT DOCUMENTS

| 6,215,726 | B1 | * | 4/2001 | Kubo .......................... 365/233 |
| 6,418,068 | B1 | * | 7/2002 | Raynham ................ 365/230.03 |
| 6,552,955 | B1 | * | 4/2003 | Miki ........................... 365/194 |
| 2002/0017939 | A1 | | 2/2002 | Okuda et al. |
| 2002/0130691 | A1 | | 9/2002 | Silvestri |
| 2002/0136082 | A1 | | 9/2002 | Chu et al. |

* cited by examiner

Primary Examiner—Huan Hoang
(74) Attorney, Agent, or Firm—Piper Rudnick LLP

(57) ABSTRACT

This invention relates to DLL driving circuit of a semiconductor memory device and a method for driving the DLL. The DLL driving circuit includes a DLL reset unit for receiving a first bank selection address, a disable-DLL signal generator for receiving a second bank selection address and a mode register set signal, and a reset driver for receiving the disable-DLL signal outputted from the disable-DLL signal generator and driving the DLL reset unit. The present invention can improve chip performance by minimizing DLL failure in installation.

19 Claims, 8 Drawing Sheets

DLL DRIVING CIRCUIT FOR USE IN SEMICONDUCTOR MEMORY DEVICE

FIELD OF THE INVENTION

The present invention relates to a semiconductor memory device and, more particularly, to a DLL driving circuit for effectively resetting a DLL and a method for driving the same.

DESCRIPTION OF THE PRIOR ART

A semiconductor memory device such as a dynamic random access memory (DRAM) operates in synchronization with a row address strobe signal (/RAS) and a column address strobe signal (/CAS), so that there is a limitation in an access speed. Therefore, in particular, a single data rate (SDR) SDRAM is widely used in systems requiring a high speed. Here, the SDRAM is a synchronous memory device which operates in synchronization with rising edges of a system clock. Currently, the SDR SDRAM is a typical memory and 256M/512M memory devices have been developed. A development of 1G memory devices tends to be advanced. As is well known, in addition to the development of the synchronous semiconductor memory device, an operating speed of the semiconductor memory device also becomes faster.

The high-speed tendency is progressed much more with an advent of a double data rate (DDR) SDRAM designed to be operable at both rising edges and falling edges of the system clock. Now, an operating speed of the DDR SDRAM is about several hundreds MHz. As is well known, the DDR SDRAM performs write and read operations at rising and falling edges, respectively. Two data per one clock are processed. In other words, data is written or read at the rising edge and the falling edge, respectively.

As a semiconductor memory device applicable to the system clock is demanded, the DDR SDRAM becomes a main stream as a next-generation memory device. In addition, it is no wonder that it is necessary to implement a reliable operation.

Meanwhile, a clock generation circuit (i.e., a delay locked loop) for compensating for a skew between an external clock and a data or a skew between an external clock and an internal clock is installed in on-chip. At this time, the DLL can be used in a semiconductor memory device of a packet command drive type, such as Rambus DRAM. The DLL is a necessary circuit employed in a high-speed memory device such as the DDR SDRAM. In addition, the DLL is a circuit for solving a timing delay of a clock.

For driving the DLL, a DLL driving circuit of FIG. 1 is needed.

Generally, a conventional DLL driving circuit includes a DLL reset signal generator 100 and a disable-DLL signal generator 200. The DLL reset signal generator 100 is driven in response to a bank selection address BANK0, an address A8 and a mode register set signal MRSP. Here, the address A8 is a signal outputted from an address input buffer (not shown), and the mode register set signal MRSP is a signal outputted from a command decoder (not shown). At this time, "P" of the reference symbol MRSP means a pulse signal.

The disable-DLL signal generator 200 is driven in response to a coded bank selection address BANK1, the mode register set signal MRSP and an address A0. Here, the disable-DLL signal generator 200 includes an RGWT signal generation unit 200A and a DIS_DLL signal generation unit 200B under the consideration of an output signal generating sequence. The RGWT signal is a read/write signal. A detailed configuration of the disable-DLL signal generator 200 can be also implemented with other logic structure.

Hereinafter, an operation of the conventional DLL driving circuit shown in FIG. 1 will be described in detail. In order to drive the DLL, commands are inputted in an arbitrarily defined order in a power-up sequence. In other words, after a power-on, the DLL is enabled in response to an extended mode register set signal (EMRS). Here, the extended mode register set signal (EMRS) is a signal obtained by extending the mode register set signal MRSP signal to the bank address. The DLL is reset in response to the mode register set signal MRSP. In other words, after the power-on, the bank selection signal is enabled in response to a combination of bank addresses BA0 and BA1, and the DLL is enabled in response to the address A0 (A0=0). Then, the DLL is reset in response to the mode register set signal MRSP and the address A8 (A8=1) through an operation of the DLL reset signal generator 100. Generally, the DLL reset signal (DLL_RESET) is generated in a high pulse form in order for the reset operation.

Meanwhile, in case of a certain chipset manufacturer, a chip controller does not employ an MRSP command, i.e., a mode register set signal for the DLL reset. In this case, it is impossible to perform the reset operation using the MRSP signal (i.e., an input signal of the DLL reset signal generator 100 shown in FIG. 1). Therefore, the DLL is not initialized, so that chip performance such as DLL locking time is badly affected. In addition, there occurs a problem that a possibility of DLL fail occurrence increases in its installation.

SUMMARY OF THE INVENTION

It is, therefore, an object of the present invention to provide a DLL driving circuit of a semiconductor memory device and a method for driving the DLL, capable of minimizing a DLL failure in installation and improving a chip performance.

Another object of the present invention is to provide a DLL driving circuit and a method for driving the DLL, in which the DLL driving circuit resets the DLL regardless of an input of a mode register set signal.

Further another object of the present invention is to provide a DLL driving circuit and a method for driving the DLL, in which the DLL driving circuit drives the reset of the DLL from a DLL enable command.

In accordance with an aspect of the present invention, there is provided a DLL driving circuit for use in a semiconductor memory device, which comprises: a DLL reset signal generation means for receiving a first bank selection address; a disable-DLL signal generation means for receiving a second bank selection address and a mode register set signal; and a reset driving means for receiving the disable-DLL signal outputted from the disable-DLL signal generation means and driving the DLL reset signal generation means.

Further, in accordance with another aspect of the present invention, there is provided a method for driving a DLL of a semiconductor memory device, which comprises the steps of: a) receiving a first bank selection address and generating a DLL reset signal; b) receiving a second bank selection address and a mode register set signal and generating a disable-DLL signal; and c) controlling a driving of the DLL reset signal in response to the disable-DLL signal, wherein the DLL reset is driven through the step c) if the mode register set signal for resetting the DLL is not inputted.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, preferred embodiments of the present invention will be descried in detail with reference to attached drawings.

Figure 2:
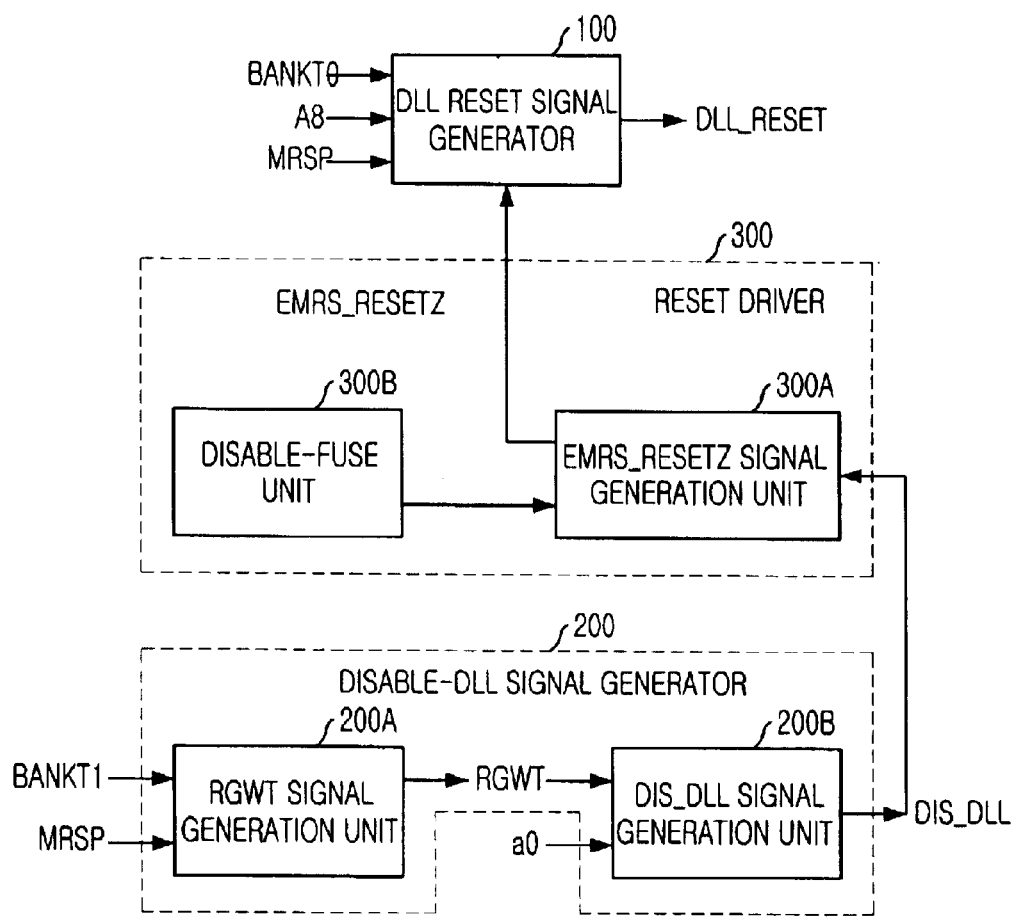
FIG. 2 is a block diagram of a DLL driving circuit in accordance with the present invention.

FIG. 2 is a block diagram of a DLL driving circuit in accordance with the present invention.

Referring to FIG. 2, the DLL driving circuit in accordance with the present invention includes a DLL reset signal generator 100 for receiving a bank selection address BANKT0, an address A8 and a mode register set signal MRSP, a disable-DLL signal generator 200 for receiving a bank selection address BANKT1, the mode register set signal MRSP and an address A0, and a reset driver 300 for receiving the disable-DLL signal DIS_DLL outputted from the disable-DLL signal generator 200 and driving the DLL reset signal generator 100.

The DLL reset signal generator 100 receives the bank selection address BANKT0 determined according to a combination of bank addresses BA0 and BA1, the address A8 outputted from an address input buffer (not shown) and the mode register set signal MRSP outputted from a command decoder (not shown), and generates the DLL reset signal DLL_RESET. Also, according to the present invention, the DLL reset signal generator 100 is driven in response to an EMRS_RESETZ signal outputted from the reset driver 300 as another signal.

Figure 1:
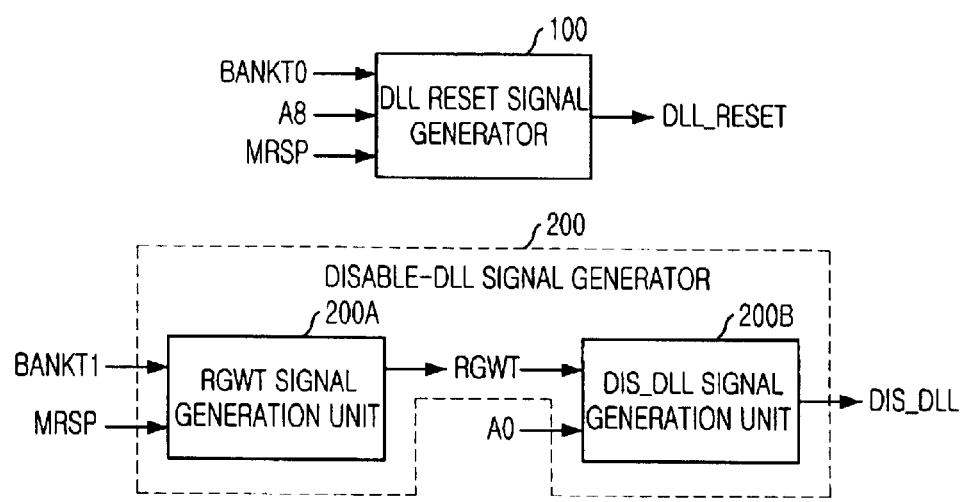
FIG. 1 is a block diagram of a conventional DLL driving circuit.

The disable-DLL signal generator 200 receives the bank selection signal BANKT1 determined according to the combination of the bank addresses BA0 and BA1, the mode register set signal MRSP outputted from the command decoder and the address A0 outputted from the address input buffer, and generates the disable-DLL signal DIS_DLL. In addition, the disable-DLL signal generator 200 includes an RGWT signal generation unit 200A and a disable-DLL signal generation unit 200B under the consideration of an output signal generating procedure. Here, the RGWT signal is a read/write signal. A detailed configuration of the disable-DLL signal generator 200 can be also implemented with other logic structure. Meanwhile, the disable-DLL signal generator 200 is implemented with the same structure as FIG. 1.

The reset driver 300 includes an EMRS_RESETZ signal generation unit 300A for receiving the disable-DLL signal DIS_DLL outputted from the disable-DLL signal generator 200 and generating an EMRS_RESETZ signal for driving the DLL reset signal generator 100. In an output operation, the reset driver 300 outputs the EMRS_RESETZ signal in response to an output of a disable-fuse unit 300B.

Hereinafter, a structure of the DLL driving circuit in accordance with an embodiment of the present invention will be described in detail.

Figure 3:
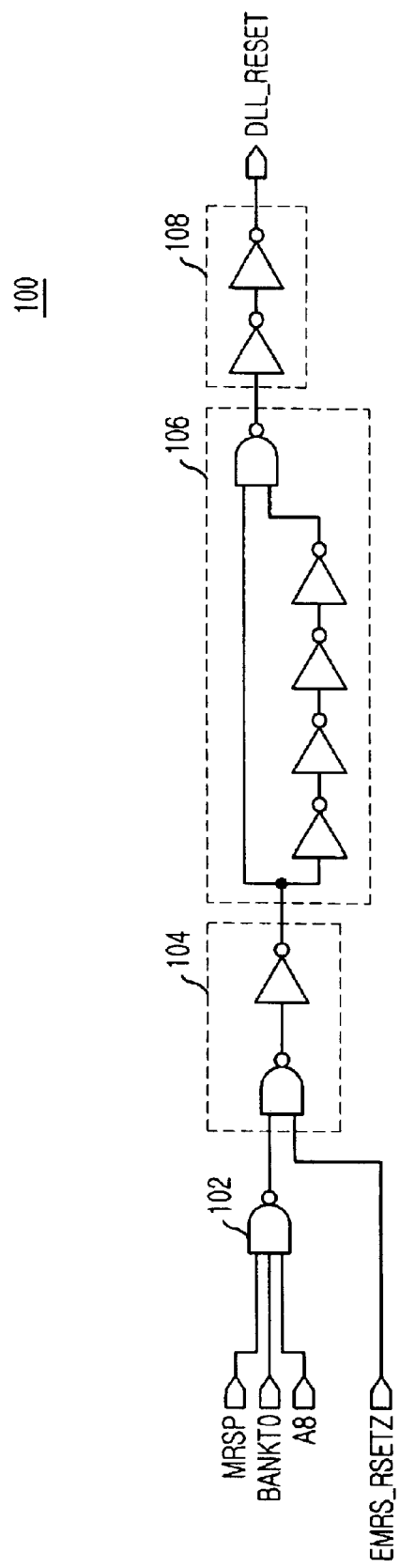
FIG. 3 is a circuit diagram illustrating the DLL reset signal generator of FIG. 2 in accordance with an embodiment of the present invention.

FIG. 3 is a circuit diagram illustrating the DLL reset signal generator 100 of FIG. 2 in accordance with an embodiment of the present invention.

Referring to FIG. 3, the DLL reset signal generator 100 includes: a first input unit 102 configured with an NAND gate for receiving the bank selection address BANKT0, the address A8 and the mode register set signal MRSP; a second input unit 104 for receiving an output signal of the first input unit 102 and the EMRS_RESETZ signal outputted from the reset driver 300; a pulse generation unit 106 for receiving an output signal of the second input unit 104 and generating it as a pulse signal; and an output unit 108 for amplifying an output signal of the pulse generation unit 106 and outputting the amplified signal. Here, the second input unit 104 is configured with an NAND gate for receiving the output signal of the first input unit 102 and the EMRS_RESETZ signal outputted from the reset driver 300, and an inverter for inverting an output signal of the NAND gate. The pulse generation unit 106 is configured with an inverter chain having four inverters connected in series to receive the output signal of the second input unit 104, and an NAND gate for receiving the output signals of the second input unit 104 and the inverter chain. The output unit 108 is configured with inverters connected in series.

In FIG. 3, the DLL reset signal generator 100 includes two paths for generating the DLL reset signal DLL_RESET. In other words, the DLL reset signal generator 100 receives the mode register set signal MRSP (this signal is inputted together with the address A8 (A8=high) and the EMRS_RESETZ signal and generates the DLL_RESET signal for resetting the DLL as the pulse signal if one of the two signals is inputted.

Figure 4:
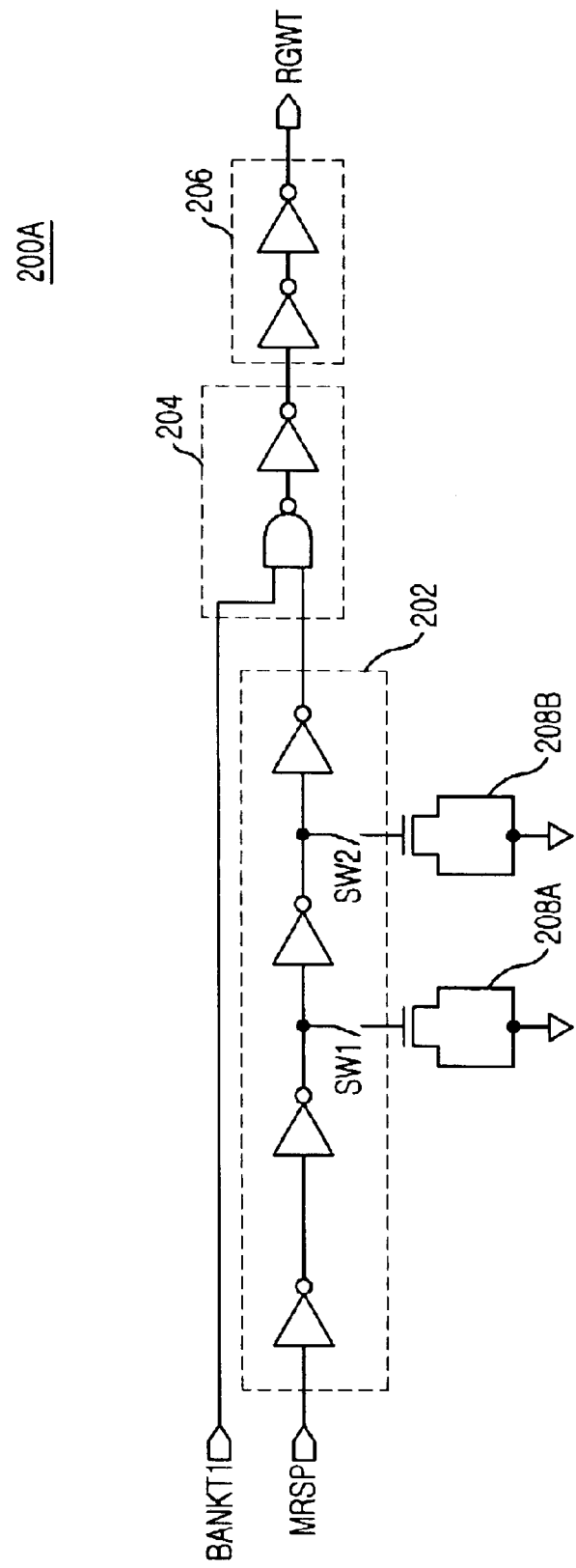
FIG. 4 is a circuit diagram illustrating an RGWT signal generation unit of FIG. 2 in accordance with an embodiment of the present invention.

FIG. 4 is a circuit diagram illustrating the RGWT signal generation unit 200A of the disable-DLL signal generator 200 in accordance with an embodiment of the present invention. Referring to FIG. 4, the RGWT signal generation unit 200A includes: an inverter chain 202 having four inverters connected in series and receiving the mode register set signal MRSP; a pulse generation unit 204 provided with an NAND gate for receiving the bank selection address BANK1 and the output signal of the inverter chain 202 and generating the pulse signal; and an output unit 206 provided with two inverters for amplifying an output signal of the pulse generation unit 204 and outputting the amplified signal. In order to control a pulse width of the pulse generation unit 204, the RGWT signal generation unit 200A further includes NMOS transistors 208A and 208B acting as capacitors, which are connected via switches SW1 and SW2 on a path of the inverter chain 202.

In the RGWT signal generation unit 200A of FIG. 4, only when the mode register set signal MRSP and the bank selection address BANKT1 are inputted in a high level, the high pulse signal is generated.

Here, an input logic of the bank selection address will be described. The case that the number of the bank is four will be described. The bank selection address is determined according to logic of the bank addresses BA0 and BA1 inputted via an external pin.

If BA0=0 and BA1=0, BANK0 is enabled,
if BA0=1 and BA1=0, BANK1 is enabled,
if BA0=0 and BA1=L, BANK2 is enabled, and
if BA0=1 and BA1=1, BANK3 is enabled.

These bank selection addresses are needed so as to distinguish the mode register set signal MRSP from an extended mode register set signal (i.e., a signal extended to the bank address). The related specification is as follow:

If BANK0+/CS, /RAS, /CAS, /WE=LOW, then "MRSP" is recognized, and
if BANK1+/CS, /RAS, /CAS, /WE=LOW, then "EMRS" is recognized.

With reference to these conditions, the mode register set signal MRSP is enabled if "BANK0+/CS, /RAS, /CAS, /WE=LOW". If the bank selection address BANK1 is enabled, the RGSW signal is generated as the pulse signal through the structure of FIG. 4.

Figure 5:
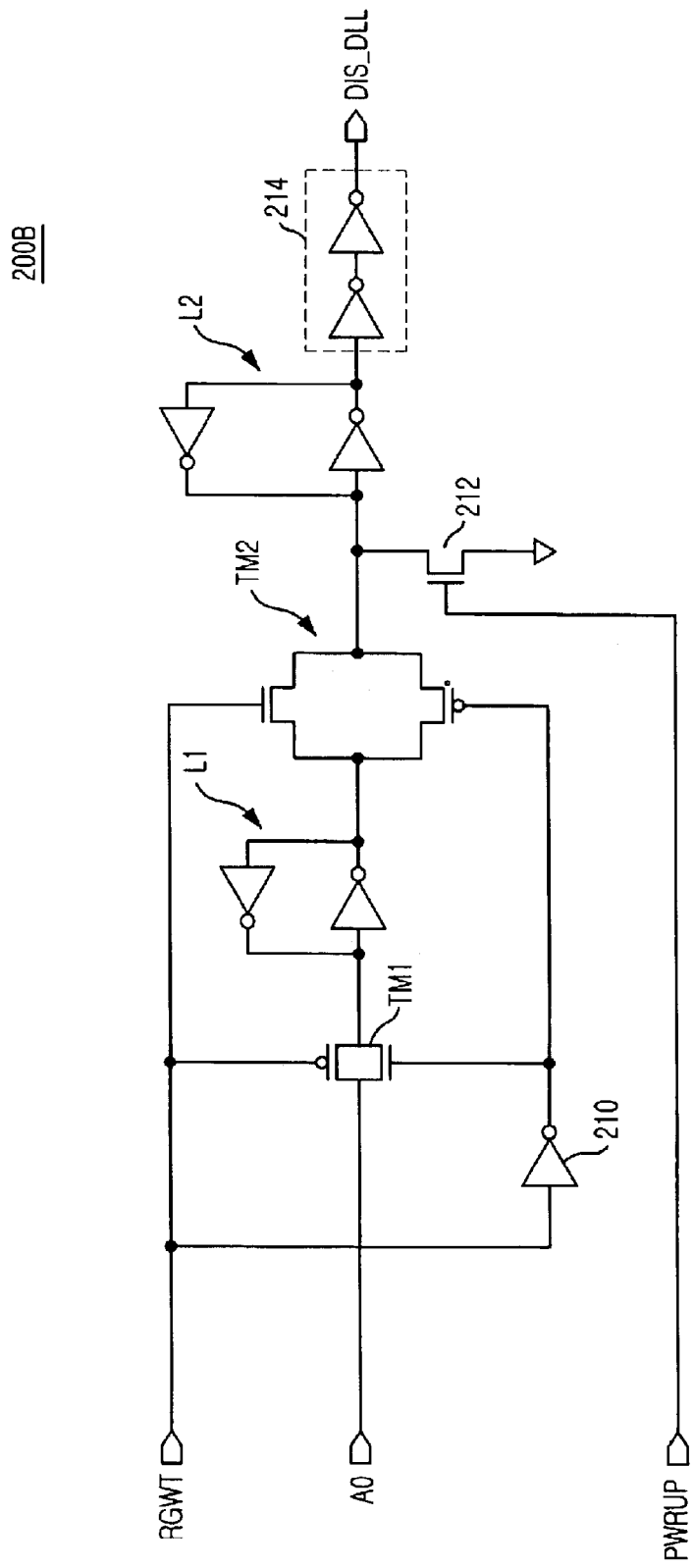
FIG. 5 is a circuit diagram illustrating a disable-DLL signal generator of FIG. 2 in accordance with an embodiment of the present invention.

FIG. 5 is a circuit diagram illustrating the disable-DLL signal generator 200 of FIG. 2 in accordance with an embodiment of the present invention. Referring to FIG. 5, the disable-DLL signal generator 200 includes: a first transmission gate TM1 formed on a path through which the address A0 is inputted and controlled by the RGWT signal outputted from the RGWT signal generation unit 200A; a first latch unit L1 formed on an output node of the first transmission gate TM1; a second transmission gate TM2 formed on a data output path of the first latch unit L1 and controlled by the RGWT signal; a second latch unit L2 formed on an output node of the second transmission gate TM2; a reset transistor 212 for resetting the output node of the second transmission gate TM2 in response to a power up signal PWRUP in a power-up state; and an output unit 214 having two inverters connected in series, for amplifying and outputting an output data of the second latch unit L2.

An operation of the disable-DLL signal generation unit 200B will be described with reference to FIG. 5. The RGWT signal is inputted in a pulse form. If the address A0 of a logic low is inputted (here, EMRS+A0(=0):DLL enable, EMRS+A0(=1):DLL disable), the disable-DLL signal DIS_DLL is synchronized under these conditions and changed from a logic low to a logic high. The disable-DLL signal DIS_DLL is initially set to a logic high by the power up signal PWRUP, so that the DLL is disabled.

Figure 6:
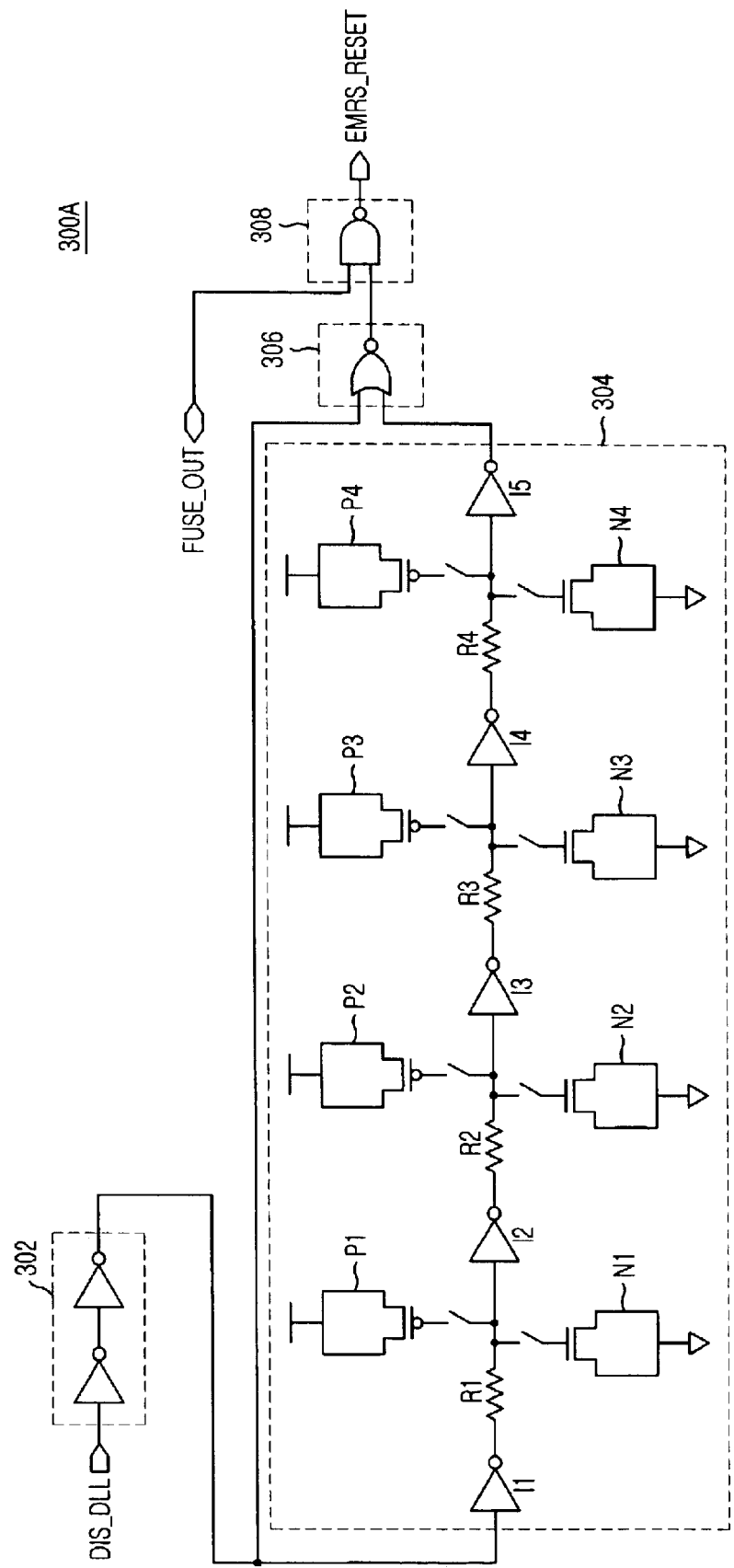
FIG. 6 is a circuit diagram illustrating an EMRS_RESETZ signal generation unit of FIG. 2 in accordance with an embodiment of the present invention.

FIG. 6 is a circuit diagram illustrating the EMRS_RESETZ signal generation unit 300A of FIG. 2 in accordance with an embodiment of the present invention. The EMRS_RESETZ signal generation unit 300A includes: an input unit 302 having two inverters connected in series and receiving the disable-DLL signal DIS_DLL; a delay unit 304 for delaying an output signal of the input unit 302; a pulse generation unit 306 having a NOR gate for receiving the output signals of the input unit 302 and the delay unit 304 and generating the pulse signal; and an output unit 308 having an NAND gate for outputting the output signal of the pulse generation unit 306 in response to a FUSE_OUT signal outputted from the disable-fuse unit, which will be described later. Here; the delay unit 304 includes an inverter chain having inverters I1, I2, I3, I4 and I5 connected in series, and resistors R1, R2, R3 and R4 are serially connected between the respective connection nodes of the inverter chain. In addition, PMOS transistors P1, P2, P3 and P4 and NMOS transistor N1, N2, N3 and N4 acting as capacitors are connected between the respective connection nodes of the inverter chain.

In FIG. 6, the EMRS_RESETZ signal unit 300A is a circuit for receiving a signal changed into a logic low and generating the pulse signal. The delay unit 304 determines the pulse width of the EMRS_RESETZ signal and uses the resistors R1, R2, R3 and R4 in order to be insensitive to process/temperature. For this reason, a specification is that clock is tMRS=2. For example, in case of 128M DDR, if the EMRS and MRSP signals are continuously inputted under conditions that tck is 3.3 ns, and 2 clocks are 6.6 ns, the pulse width must be adjusted in order to prevent a collision of the pulse.

Figure 7:
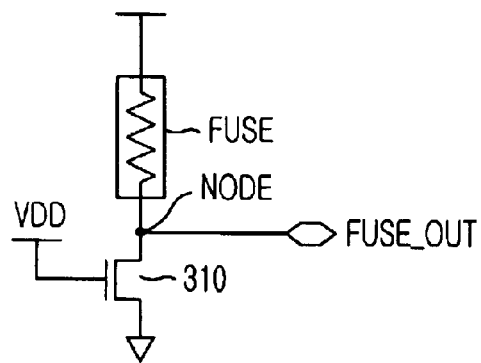
FIG. 7 is a circuit diagram illustrating a disable-fuse unit in accordance with an embodiment of the present invention.

FIG. 7 is a circuit diagram illustrating the disable-fuse unit 300B of FIG. 2 in accordance with an embodiment of the present invention. The disable-fuse unit 300B includes: a fuse connected between a power supply voltage VDD and an output node NODE; an NMOS transistor 310 acting as a resistor, which is connected between the output node NODE and the power supply voltage VDD and has a gate connected to the power supply voltage VDD; and the output node NODE for outputting the disable-fuse signal FUSE_OUT.

In FIG. 7, if the fuse is not cut, the EMRS_RESETZ signal generation unit 300A can be allowed to generate the EMRS_RESETZ signal by maintaining the output signal FUSE_OUT to a logic high. However, if the EMRS_RESETZ signal is needed, the fuse is cut so that the EMRS_RESETZ signal is disabled to a logic high regardless of the disable-DLL signal DIS_DLL.

Figure 8:
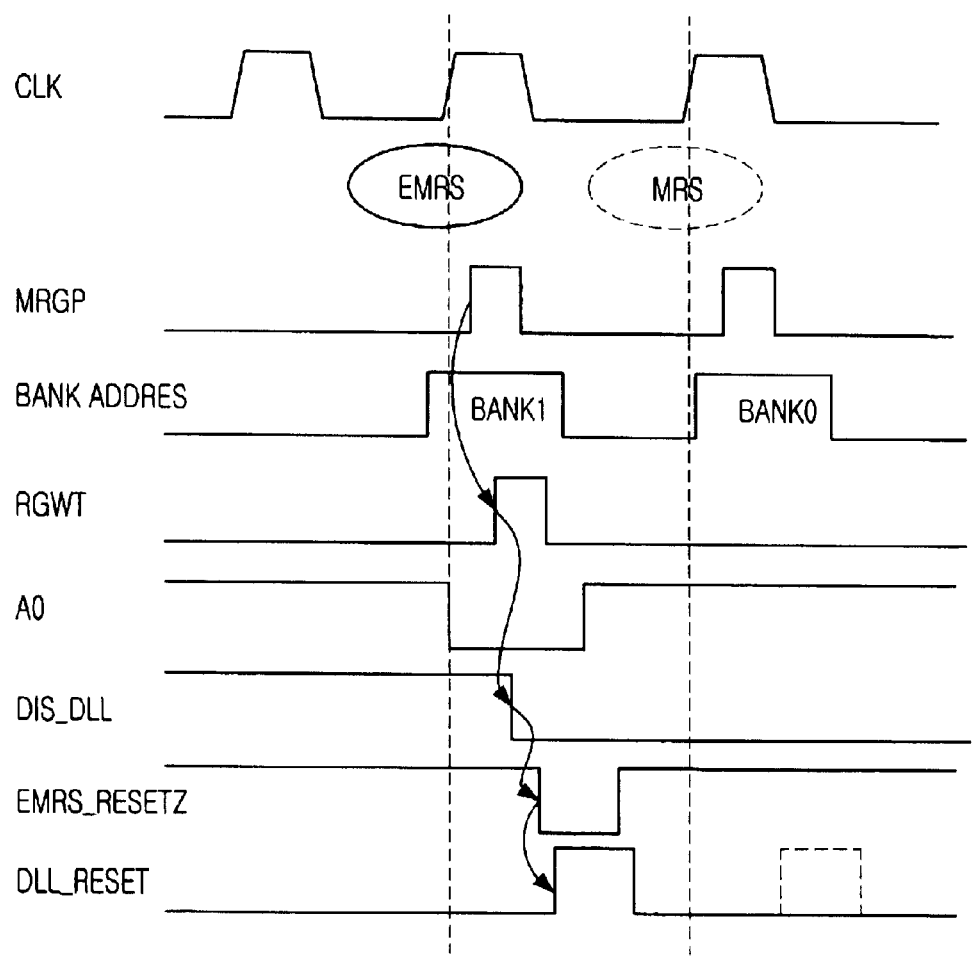
FIG. 8 is a timing diagram illustrating an operation of the DLL driving circuit of FIG. 2.

FIG. 8 is a timing diagram of the DLL driving circuit of FIG. 2.

Hereinafter, an operation characteristic of the DLL driving circuit of FIG. 2 will be described with reference to FIG. 8.

In FIG. 2, the DLL reset signal and the disable-DLL signal are designed without relation to each other. It can be easily understood if considering an assumption that the DLL reset and DLL enable signal must be inputted in a power-on (or a power-up) sequence of a specification. Therefore, the present invention uses the EMRS command that must be inputted in order to enable the DLL. That is, even if the MRSP command for resetting the DLL is not inputted, the reset pulse is enabled. In other words, when the disable-DLL signal DIS_DLL is changed from a logic high to a logic low, the EMRS_RESETZ signal generation unit 300A generates the EMRS_RESETZ signal using the disable-DLL signal. Then, the EMRS_RESETZ signal is connected to an input terminal of the DLL reset signal generation unit 100A for generating the DLL reset signal DLL_RESET. The DLL reset signal generator 100 can generate the DLL reset signal DLL_RESET if any one of the MRSP command and the EMRS_RESETZ is inputted. Referring to FIG. 8, it can be seen that the DLL reset signal DLL_RESET is generated from the EMRS_RESETZ signal.

In addition, in the chipset in which the MRSP command is certainly inputted, the disable-fuse unit 300B is used to unconditionally disable the EMRS_RESETZ signal.

As described above, the DLL driving circuit in accordance with the present invention can automatically reset the DLL using only the DLL enable command without the DLL reset command. Therefore, a DLL related failure can be prevented in installation. Further, if the DLL driving method of the present invention is applied, a limitation of chip controller can be solved.

While the present invention has been described with respect to certain preferred embodiments only, other modifications and variation may be made without departing from the spirit and scope of the present invention as set forth in the following claims.

What is claimed is:

1. A DLL driving circuit for use in a semiconductor memory device, the DLL driving circuit comprising:
   a DLL reset signal generation means for receiving a first bank selection address, a first address and a mode register set signal in order to generate a DLL reset signal;
   a disable-DLL signal generation means for receiving a second bank selection address and the mode register set signal in order to generate a disable-DLL signal; and
   a reset driving means for receiving the disable-DLL signal outputted from the disable-DLL signal generation means and driving the DLL reset signal generation means.

2. The DLL driving circuit recited in claim 1, wherein the DLL reset signal generation means includes:
   a first input unit for receiving the first bank selection address, the first address outputted from an address buffer and the mode register set signal;
   a second input unit for receiving an output signal of the first input unit and an output signal of the reset driving means;
   a pulse generation means for receiving an output signal of the second input unit and generating a pulse signal; and
   an output means for amplifying and outputting an output signal of the pulse generation unit.

3. The DLL driving circuit as recited in claim 2, wherein the disable-DLL signal generation means receives at least the second bank selection address determined by a combination of bank addresses, the mode register set signal outputted from a command decoder, and a second address outputted from an address buffer and generates the disable-DLL signal.

4. The DLL driving circuit as recited in claim 3, wherein the disable-DLL signal generation means includes:
   an RGWT signal generation unit for receiving the second bank selection address and the mode register set signal; and
   a disable-DLL signal generation unit for receiving an output signal of the RGWT signal generation unit and the second address.

5. The DLL driving circuit as recited in claim 4, wherein the RGWT signal generation unit includes:
   an inverter chain for receiving the mode register set signal;
   a pulse generation unit for receiving the second bank selection address and an output signal of the inverter chain and generating a pulse signal; and
   an output unit for amplifying and outputting an output signal of the pulse generation unit.

6. The DLL driving circuit as recited in claim 5, wherein the disable-DLL signal generation means includes:
   a first transmission gate formed on a path through which the second address is inputted and controlled by the RGWT signal outputted from the RGWT signal generation unit;
   a first latch unit formed on an output node of the first transmission gate;
   a second transmission gate formed on a data output path of the first latch unit and controlled by the RGWT signal;
   a second latch unit formed on an output node of the second transmission gate;
   a reset transistor for resetting the output node of the second transmission gate in response to a power up signal; and
   an output unit having two inverters connected in series, for amplifying and outputting an output data of the second latch unit.

7. The DLL driving circuit as recited in claim 1, wherein the reset driving means includes an EMRS_RESETZ signal generation unit for receiving the disable-DLL signal outputted from the disable-DLL signal generation means in order to generate an EMRS_RESETZ signal for driving the DLL reset signal generation means.

8. The DLL driving circuit as recited in claim 7, wherein the reset driving means further includes a disable-fuse unit for the EMRS_RESETZ signal generation unit to output the EMRS_RESETZ signal, in response to disable-fuse signal outputted from the disable-fuse unit.

9. The DLL driving circuit as recited in claim 8, wherein the disable-fuse unit includes:
   a fuse connected between a power supply voltage and an output node;
   a transistor acting as a resistor, the transistor being connected between the output node and the power supply voltage and having a gate connected to the power supply voltage; and
   an output node for outputting the disable-fuse signal.

10. The DLL driving circuit as recited in claim 8, wherein the driving means includes:
    an input unit for receiving the disable-DLL signal;
    a delay unit for delaying an output signal of the input unit;
    a pulse generation unit for receiving an output signal of the delay unit and generating a pulse signal; and
    an output unit for outputting the pulse signal in response to an output signal of the disable-fuse unit.

11. The DLL driving circuit as recited in claim 10, wherein the disable-fuse unit includes:
    a fuse connected between a power supply voltage and an output node;
    a transistor acting as a resistor, the transistor being connected between the output node and the power supply voltage and having a gate connected to the power supply voltage; and
    an output node for outputting the disable-fuse signal.

12. A method for driving a DLL of a semiconductor memory device, the method comprising the steps of:
    receiving a first bank selection address and generating a DLL reset signal for resetting the DLL;
    b) receiving a second bank selection address and a mode register set signal and generating a disable-DLL signal; and
    c) controlling a driving of the DLL reset signal in response to the disable-DLL signal,
    wherein the resetting of the DLL is driven through the step c) if the mode register set signal for resetting the DLL is not inputted.

13. The method as recited in claim 12, wherein the DLL reset signal is outputted from a DLL reset signal generation means, the DLL reset signal generation means including:
    a first input unit for receiving the first bank selection address, a first address outputted from an address buffer and the mode register set signal;
    a second input unit for receiving an output signal of the first input unit and an output signal of the reset driving means;

a pulse generation means for receiving an output signal of the second input unit and generating a pulse signal; and an output means for amplifying and outputting an output signal of the pulse generation unit.

14. The method as recited in claim 13, wherein the disable-DLL signal is generated in response to a second bank selection address determined by a combination of bank addresses, the mode register set signal outputted from a command decoder, and a second address outputted from an address buffer.

15. The method as recited in claim 14, wherein the disable-DLL signal is outputted from a disable-DLL signal generation means, the disable-DLL signal generation means including:

an RGWT signal generation unit for receiving the second bank selection address and the mode register set signal; and a disable-DLL signal generation unit for receiving an output signal of the RGWT signal generation unit and the second address.

16. The method as recited in claim 12, wherein the step c) is carried out by a reset driving means for receiving the disable-DLL signal and outputting the DLL reset signal.

17. The method as recited in claim 16 wherein the reset driving means further includes a disable-fuse unit, the reset driving means outputting the DLL reset signal in response to an output signal of the disable-fuse unit.

18. A semiconductor memory, device having a DLL, comprising:

a DLL reset signal generation means for receiving a first bank selection address, a first address and a mode register set signal in order to generate a DLL reset signal for resetting the DLL;

an RGWT signal generation means for receiving a second bank selection address and the mode register set signal; and a disable-DLL signal generation means for receiving an output signal of the RGWT signal generation means and a second address in order to generate a disable-DLL signal;

a reset driving means for receiving the disable-DLL signal in order to generate an $EMRS_{13}$ RESETZ signal for driving the DLL reset signal generation means, wherein the resetting of the DLL is driven through the reset driving means if the mode register set signal for resetting the DLL is not inputted.

19. The semiconductor memory device as recited in claim 18, wherein the reset driving means further includes a disable-fuse unit for the reset driving means to output the EMRS_RESETZ signal, in response to an output signal of the disable-fuse unit.

* * * * *